US012772369B2

(12) United States Patent
Matsumoto et al.

(10) Patent No.: US 12,772,369 B2
(45) Date of Patent: Oct. 20, 2026

(54) DEVICE EMBEDDED SUBSTRATE AND MANUFACTURING METHOD OF SAME

(71) Applicant: Meiko Electronics Co., Ltd., Ayase (JP)

(72) Inventors: Tohru Matsumoto, Ayase (JP); Masakatsu Ishihara, Ayase (JP); Kazuhiro Beniya, Ayase (JP); Kentaro Aoki, Ayase (JP)

(73) Assignee: MEIKO ELECTRONICS CO., LTD., Ayase (JP)

( * ) Notice: Subject to any disclaimer, the term of this patent is extended or adjusted under 35 U.S.C. 154(b) by 347 days.

(21) Appl. No.: 18/279,735

(22) PCT Filed: Mar. 5, 2021

(86) PCT No.: PCT/JP2021/008664
§ 371 (c)(1),
(2) Date: Aug. 31, 2023

(87) PCT Pub. No.: WO2022/185522
PCT Pub. Date: Sep. 9, 2022

(65) Prior Publication Data

US 2024/0138053 A1 Apr. 25, 2024
US 2024/0237189 A9 Jul. 11, 2024

(51) Int. Cl.
*H05K 1/02* (2006.01)
*H05K 1/11* (2006.01)
*H05K 3/46* (2006.01)

(52) U.S. Cl.
CPC ........... *H05K 1/0209* (2013.01); *H05K 1/115* (2013.01); *H05K 3/4655* (2013.01); *H05K 2201/096* (2013.01); *H05K 2201/10416* (2013.01)

(58) Field of Classification Search
CPC .. H05K 1/0201; H05K 1/0203; H05K 1/0204; H05K 1/0298; H05K 1/11;
(Continued)

(56) References Cited

U.S. PATENT DOCUMENTS 9,860,990 B1 1/2018 Lee et al.
2013/0027896 A1 1/2013 Lee et al.
(Continued)

FOREIGN PATENT DOCUMENTS

JP 2013-513970 A 4/2013
JP 2018-049938 A 3/2018
(Continued)

*Primary Examiner* — Roshn K Varghese
(74) *Attorney, Agent, or Firm* — Volpe Koenig

(57) ABSTRACT

A device embedded substrate provided with first and second connecting terminals on different surfaces, the substrate including: an electrically conductive metal block having one surface connected to the first connecting terminal, and having a dimension in a lateral direction larger than that of the electronic device; an intermediate connecting portion juxtaposed to the electronic device, including first insulation layer and wiring layers, whereby the first wiring layer is connected to the one surface of the metal block via a first conductive via; a second insulation layer which accommodates the metal block; and a third insulation layer stacked on the second insulation layer to embed the electronic device and whereon a second wiring layer is stacked, wherein the second wiring layer is connected to the first wiring layer via a second conductive via and connected to the second connecting terminal of the electronic device via a third conductive via.

20 Claims, 15 Drawing Sheets

(58) Field of Classification Search
CPC ........ H05K 1/111; H05K 1/115; H05K 1/116; H05K 1/185
See application file for complete search history.

(56) References Cited

U.S. PATENT DOCUMENTS

| | | | | |
|---|---|---|---|---|
| 2013/0134589 | A1 | 5/2013 | Mengel et al. | |
| 2014/0342679 | A1* | 11/2014 | Choudhury | H01L 24/19 455/90.2 |
| 2018/0019178 | A1 | 1/2018 | Lin et al. | |
| 2022/0102311 | A1* | 3/2022 | Fuergut | H05K 1/185 |

FOREIGN PATENT DOCUMENTS

| | | | |
|---|---|---|---|
| JP | 6716045 | B1 | 7/2020 |
| JP | 2020-174148 | A | 10/2020 |
| WO | 2015/016017 | A1 | 2/2015 |
| WO | 2017/187559 | A1 | 11/2017 |
| WO | 2020/250405 | A1 | 12/2020 |

* cited by examiner

DEVICE EMBEDDED SUBSTRATE AND MANUFACTURING METHOD OF SAME

TECHNICAL FIELD

The present invention relates to a device embedded substrate and a manufacturing method of the device embedded substrate.

BACKGROUND ART

A configuration is known in which, in a printed wiring board to which a heat-producing device is surface-mounted, the heat-producing device and a heat sink are respectively provided on both surfaces of a substrate so as to sandwich, for example, a heat-transfer member provided so as to penetrate the substrate. According to such a configuration, heat generated by the heat-producing device mounted to one surface of the substrate can be dissipated by being transferred via the heat-transfer member to the heat sink arranged on the other surface of the substrate. In this case, by forming the heat-transfer member which constitutes a heat-dissipating path between the heat-producing device and the heat sink as a metal piece made of, for example, a block of copper, a sectional area of the heat-dissipating path can be readily secured as compared to a case where a plurality of thermal vias are formed and heat can be dissipated in an efficient manner even when an amount of heat generation by the heat-producing device is relatively large.

Among heat-producing devices such as that described above, electronic devices including inverters and converters are recently confronted with a need for downsizing while, at the same time, improving switching speed. Therefore, if a power element used in the electronic device can be embedded in the printed wiring board, a mounting area can be saved and the substrate can be downsized in a similar manner to a conventional device embedded substrate and, by reducing a wiring length, electric performance can be improved by reducing wiring resistance and an effect of a reactance component.

On the other hand, generally, in a conventional device embedded substrate, an electrode terminal provided on one surface of an electronic device and a conductive pattern formed on the substrate are connected by a conductive via. When embedding an electronic device having electrode terminals formed on both surfaces thereof into the substrate, a conductive via for transmitting and receiving signals must be formed on both surfaces of the electronic device, but doing so prevents a heat dissipation mechanism which dissipates heat efficiently using a heat-transfer member from being introduced.

In consideration thereof, in the related art disclosed in Patent Document 1, a configuration is adopted in which a heat-transfer member in contact with an entire bottom surface of an embedded electronic device is to be embedded in a device embedded substrate so as to extend to a conductive layer on a rear surface of the substrate. As a result, the related art enables an electrode terminal provided on the bottom surface of the electronic device and the conductive layer on the rear surface of the substrate to be conductively connected to each other via the heat-transfer member and, at the same time, enables an efficient heat-dissipating path to be secured from the entire bottom surface of the electronic device to the conductive layer on the rear surface of the substrate via the heat-transfer member. Therefore, according to the related art, heat dissipation characteristics can be improved even when an electronic device in which electrode terminals are formed on both surfaces thereof is embedded.

PRIOR ART DOCUMENT

Patent Document

Patent Document 1: Japanese Patent No. 6716045

SUMMARY OF THE INVENTION

Problems to be Solved by the Invention

However, with the related art described above, when conductively connecting the electrode terminal on the bottom surface of the embedded electronic device to a conductive layer on a front surface of the substrate, a through-hole which conductively connects the conductive layer on the rear surface of the substrate and the conductive layer on the front surface of the substrate to each other must be formed, thereby creating a risk that an area occupied by the through-hole and an increase in wiring length may inhibit downsizing and noise reduction of the substrate.

The present invention has been made in view of the circumstances described above and an object thereof is to provide, even when an electronic device to be embedded in a substrate capable of efficiently dissipating heat is provided with electrode terminals on both surfaces, a device embedded substrate capable of conductively connecting the electrode terminals on both surfaces to a conductive layer on one surface while achieving downsizing and noise reduction and a manufacturing method of the device embedded substrate.

Means for Solving the Problems

In order to achieve the above object, a device embedded substrate according to the present invention is a device embedded substrate into which is embedded an electronic device provided with a first connecting terminal on one surface and a second connecting terminal on another surface, the device embedded substrate including: a metal block which has electrical conductivity and a heat-transfer property, which has one surface to which the first connecting terminal of the electronic device is connected, and of which a dimension in a lateral direction is larger than that of the electronic device; an intermediate connecting portion which is juxtaposed to the electronic device in the lateral direction, which includes a first insulation layer and a first wiring layer, and of which the first wiring layer is connected to the one surface of the metal block via a first conductive via that penetrates the first insulation layer; a second insulation layer which accommodates the metal block; and a third insulation layer which is stacked on the second insulation layer so as to embed the electronic device and on which a second wiring layer is stacked, wherein the second wiring layer includes a first terminal conducting portion which is connected to the first wiring layer via a second conductive via that penetrates the third insulation layer and a second terminal conducting portion which is connected to the second connecting terminal of the electronic device via a third conductive via that penetrates the third insulation layer.

In addition, a manufacturing method of a device embedded substrate according to the present invention is a manufacturing method of a device embedded substrate into which is embedded an electronic device provided with a first connecting terminal on one surface and a second connecting terminal on another surface, the manufacturing method including: a block preparation step of preparing a metal block which has electrical conductivity and a heat-transfer property and of which a dimension in a lateral direction is larger than that of the electronic device; an intermediate connection step of connecting the first connecting terminal of the electronic device to one surface of the metal block, stacking a first insulation layer and a first wiring layer by juxtaposing the first insulation layer and the first wiring layer in the lateral direction on the electronic device, and connecting the first wiring layer with a first conductive via that penetrates the first insulation layer; an accommodation step of accommodating the metal block in a second insulation layer; a buildup step of stacking a third insulation layer and a second wiring layer on the second insulation layer so as to embed the electronic device; and a via connection step of forming, in the second wiring layer, a first terminal conducting portion to be connected to the first wiring layer by a second conductive via that penetrates the third insulation layer and a second terminal conducting portion to be connected to the second connecting terminal of the electronic device by a third conductive via that penetrates the third insulation layer.

Furthermore, a manufacturing method of a device embedded substrate according to the present invention is a manufacturing method of a device embedded substrate into which is embedded an electronic device provided with a first connecting terminal on one surface and a second connecting terminal on another surface, the manufacturing method including: a block preparation step of preparing a metal block which has electrical conductivity and a heat-transfer property and of which a dimension in a lateral direction is larger than that of the electronic device; an embedding step of forming a second insulation layer and an inner wiring layer so as to embed the metal block; an intermediate connection step of separating a part of the inner wiring layer opposing the metal block by patterning as a first wiring layer and providing a first conductive via which connects the first wiring layer and one surface of the metal block to each other; a device accommodation step of exposing a part of the one surface of the metal block by counterboring and accommodating the electronic device so that the first connecting terminal comes into contact with the metal block; a buildup step of stacking a third insulation layer and a second wiring layer on the inner wiring layer so as to embed the electronic device; and a via connection step of forming, in the second wiring layer, a first terminal conducting portion to be connected to the first wiring layer by a second conductive via that penetrates the third insulation layer and a second terminal conducting portion to be connected to the second connecting terminal of the electronic device by a third conductive via that penetrates the third insulation layer.

Advantageous Effects of the Invention

According to the present invention, even when an electronic device to be embedded in a substrate capable of efficiently dissipating heat is provided with electrode terminals on both surfaces, a device embedded substrate capable of conductively connecting the electrode terminals on both surfaces to a conductive layer on one surface while achieving downsizing and noise reduction and a manufacturing method of the device embedded substrate can be provided.

MODE FOR CARRYING OUT THE INVENTION

Hereinafter, embodiments of the present invention will be described in detail with reference to the drawings. Note that the present invention is not limited to the contents described below and that the present invention can be arbitrarily modified and implemented without changing the gist thereof. In addition, since all of the drawings used for explaining the embodiments schematically show constituent members and have been partially emphasized, enlarged, reduced, omitted, or the like in order to promote understanding of the constituent members, the drawings may not accurately represent the scales, shapes, or the like of the constituent members.

First Embodiment

Figure 1:
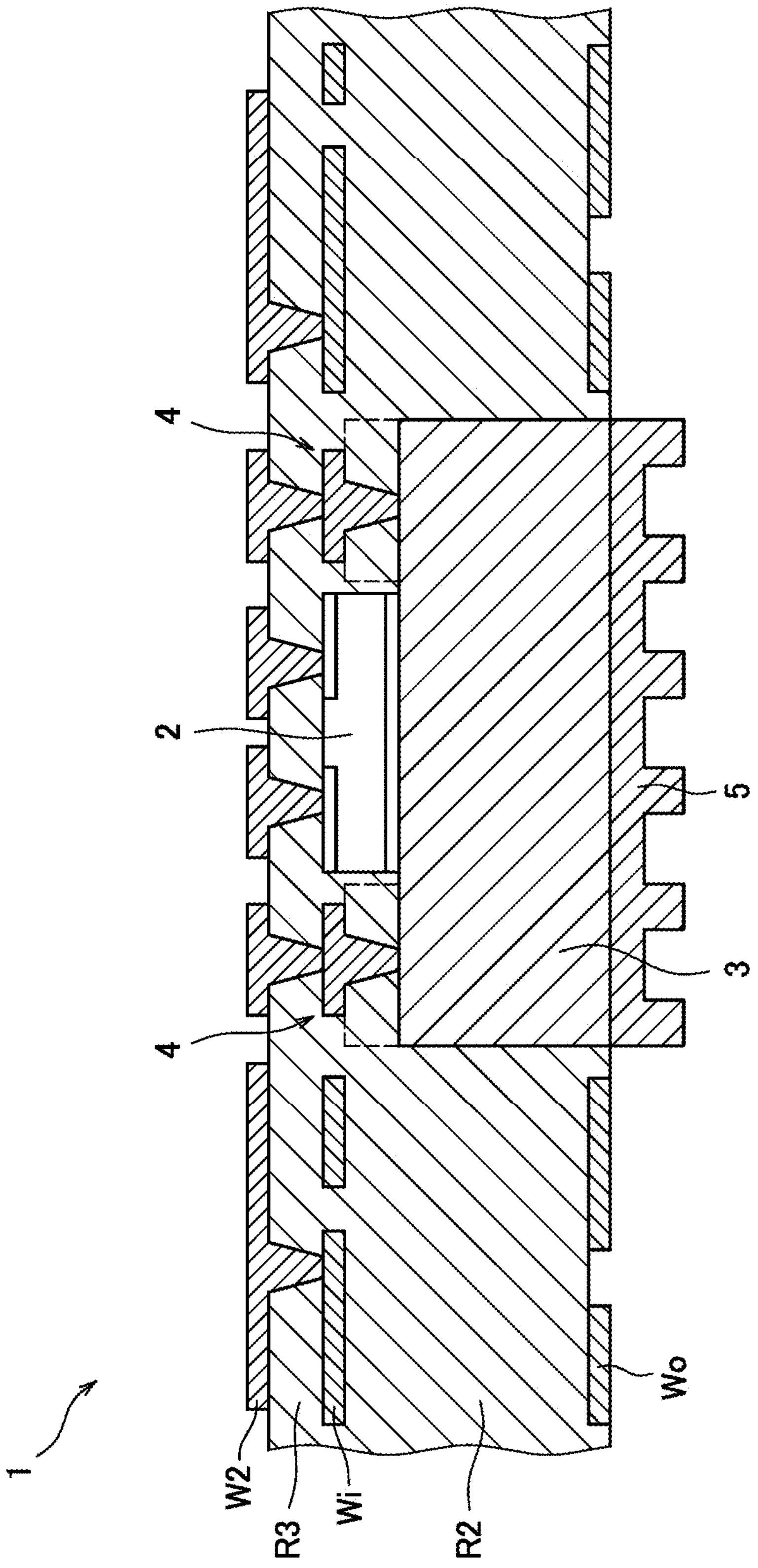
FIG. 1 is a sectional view representing a device embedded substrate according to a first embodiment.

FIG. 1 is a sectional view representing a device embedded substrate 1 according to a first embodiment. The device embedded substrate 1 is configured such that an electronic device 2, a metal block 3, and an intermediate connecting portion 4 are embedded in a multi-layer board made up of a plurality of insulation layers and wiring layers, and the device embedded substrate 1 is provided with a heat sink 5 when necessary. For example, the device embedded substrate 1 can be used in various applications such as electronic equipment including a mobile phone, a notebook PC, and a digital camera, control apparatuses in various in-vehicle devices, and the like.

Hereinafter, a manufacturing method of the device embedded substrate 1 according to the first embodiment of the present invention will be described in detail with reference to FIGS. 2 to 5. The manufacturing method of the device embedded substrate 1 according to the first embodiment includes a block preparation step, an intermediate connection step, an accommodation step, a buildup step, and a via connection step.

Figure 2:
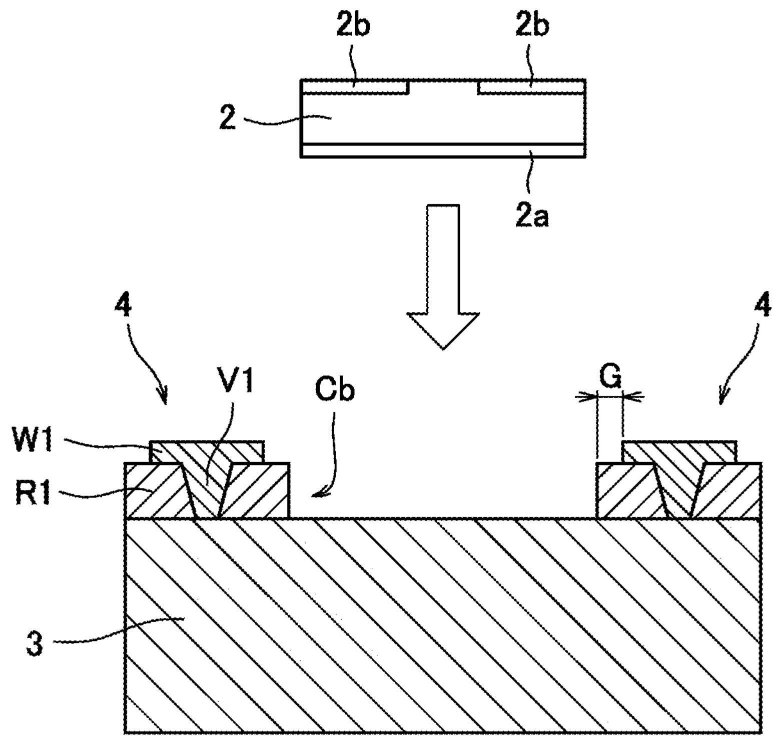
FIG. 2 is a sectional view representing a block preparation step and an intermediate connection step according to the first embodiment.

FIG. 2 is a sectional view representing the block preparation step and the intermediate connection step according to the first embodiment. In this case, the electronic device 2 to be embedded in the device embedded substrate 1 is provided with a first connecting terminal 2*a* on one surface and a second connecting terminal 2*b* on another surface. For example, the electronic device 2 according to the present embodiment is a so-called power MOSFET (Metal Oxide Semiconductor Field Effect Transistor) to be used in an inverter, a converter, or the like in which case the first connecting terminal 2*a* is provided as a drain and two second connecting terminals 2*b* are respectively provided as a gate and a source.

In the manufacturing of the device embedded substrate 1 according to the first embodiment, first, the metal block 3 which has electrical conductivity and a heat-transfer property is prepared (the block preparation step). In the present embodiment, the metal block 3 is a block made of copper with a rectangular parallelopiped shape and is configured such that a dimension in a lateral direction is larger than that of the electronic device 2 when embedded in the substrate.

In addition, the intermediate connecting portion 4 is juxtaposed in the lateral direction on one surface of the prepared metal block 3 and connected together with the electronic device 2 (the intermediate connection step). More specifically, a first insulation layer R1 and a first wiring layer W1 are stacked on an upper surface of the metal block 3, a counterbored portion Cb for accommodating the electronic device 2 is formed by a laser and, at the same time, the intermediate connecting portion 4 is formed by connecting the first wiring layer W1 and the metal block 3 to each other by a first conductive via V1 that penetrates the first insulation layer R1. Furthermore, the electronic device 2 is accommodated in the counterbored portion Cb so as to connect the first connecting terminal 2*a* to the metal block 3. In this case, the first connecting terminal 2*a* of the electronic device 2 is connected to the metal block 3 via an adhesive material (not illustrated) such as a high-temperature solder, a conductive adhesive, a sintering agent, or the like having superior electrical conductivity and heat-transfer property.

While the intermediate connecting portion 4 is provided on both sides in the lateral direction so as to sandwich the electronic device 2 in the present embodiment, only one of the intermediate connecting portions 4 may be provided, in which case a dimension of the metal block 3 in the lateral direction may be reduced.

In addition, a patterning area is configured such that a distance to the electronic device 2 in the lateral direction from the first wiring layer W1 is greater by a gap G shown in the drawing than a distance to the electronic device 2 in the lateral direction from the first insulation layer R1. Accordingly, even when the electronic device 2 handles a relatively large current, a short-circuit between the first wiring layer W1 and the second connecting terminal 2*b* can be prevented.

Figure 3:
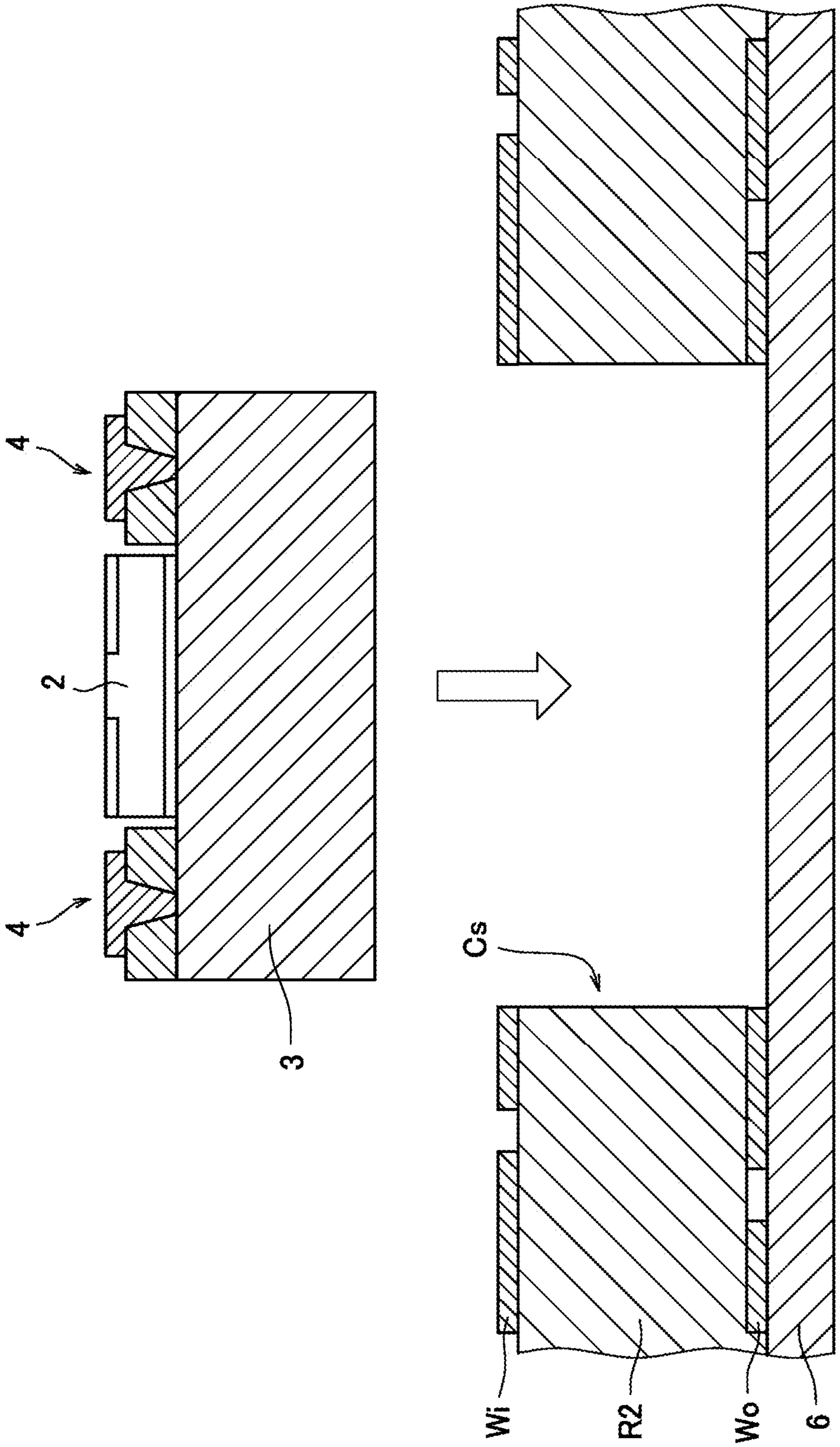
FIG. 3 is a sectional view representing an accommodation step according to the first embodiment.

FIG. 3 is a sectional view representing the accommodation step according to the first embodiment. The metal block 3 to which the electronic device 2 and the intermediate connecting portion 4 have been connected in the intermediate connection step is accommodated in a second insulation layer which is thicker than the metal block 3 (the accommodation step). In this case, the second insulation layer is adopted as a double-sided board provided on respective surfaces thereof with an outer wiring layer Wo to be an outer layer pattern of the device embedded substrate 1 and an inner wiring layer Wi to be an inner layer pattern of the device embedded substrate 1. More specifically, in the accommodation step, an accommodating portion Cs for accommodating the electronic device 2 is formed in a known copper clad laminate (CCL) having been subjected to patterning and the electronic device 2 is accommodated in the accommodating portion Cs using a temporary fixing tape 6.

Figure 4:
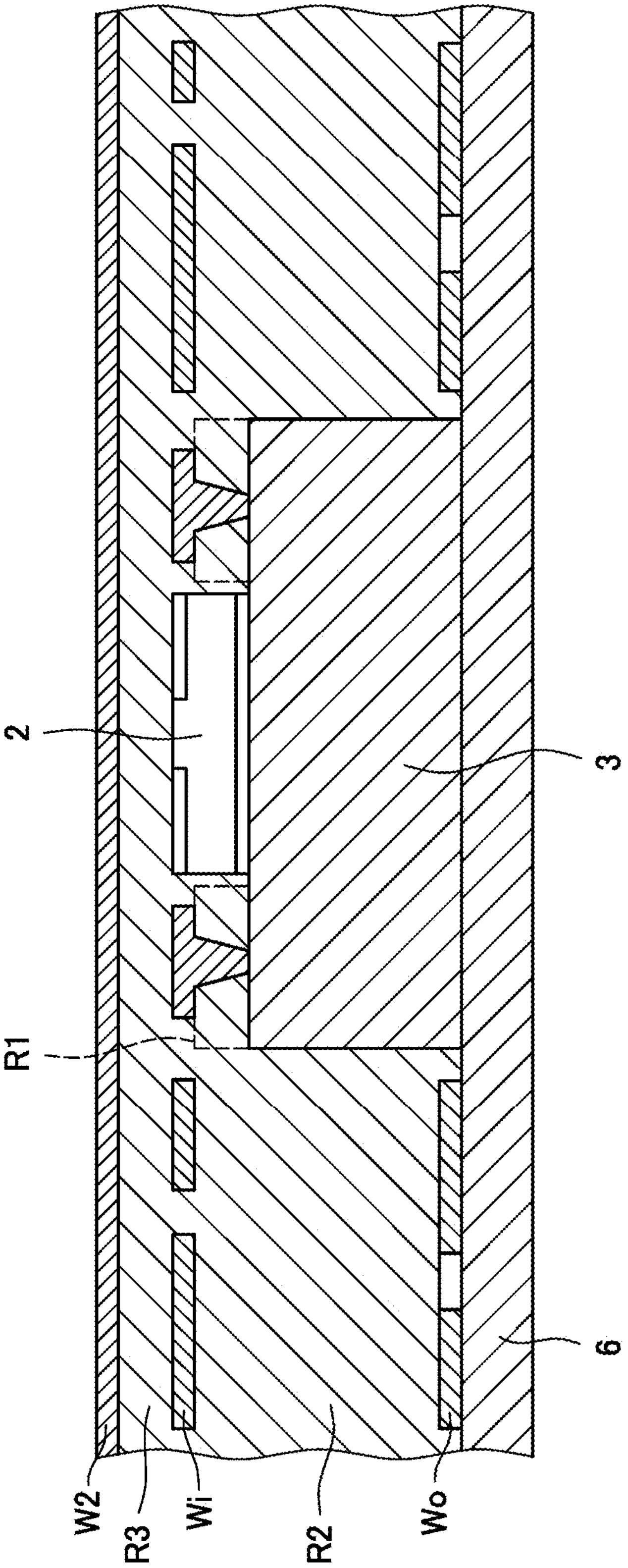
FIG. 4 is a sectional view representing a buildup step according to the first embodiment.

FIG. 4 is a sectional view representing the buildup step according to the first embodiment. A third insulation layer R3 and a second wiring layer W2 are stacked on the second insulation layer R2 having accommodated the metal block 3 in the accommodation step so as to embed the electronic device 2 connected to the metal block 3 (the buildup step). In the present step, for example, a prepreg is arranged so as to straddle the electronic device 2, the intermediate connecting portion 4, and the copper clad laminate and, at the same time, a buildup layer is formed by laminating a copper foil and subjecting the copper foil to heat and pressure.

In this case, both a gap between the electronic device 2 and the intermediate connecting portion 4 and a gap between a wall surface of the accommodating portion Cs and the metal block 3 are filled in a gapless manner due to an inflow of the prepreg which flows during the process of the buildup step. Therefore, preferably, the gaps are configured to be as narrow as possible so that no voids remain. In addition, the first insulation layer R1 of the intermediate connecting portion 4 is integrated with its surroundings by being formed by a same resin material as the second insulation layer R2 and the third insulation layer R3.

Figure 5:
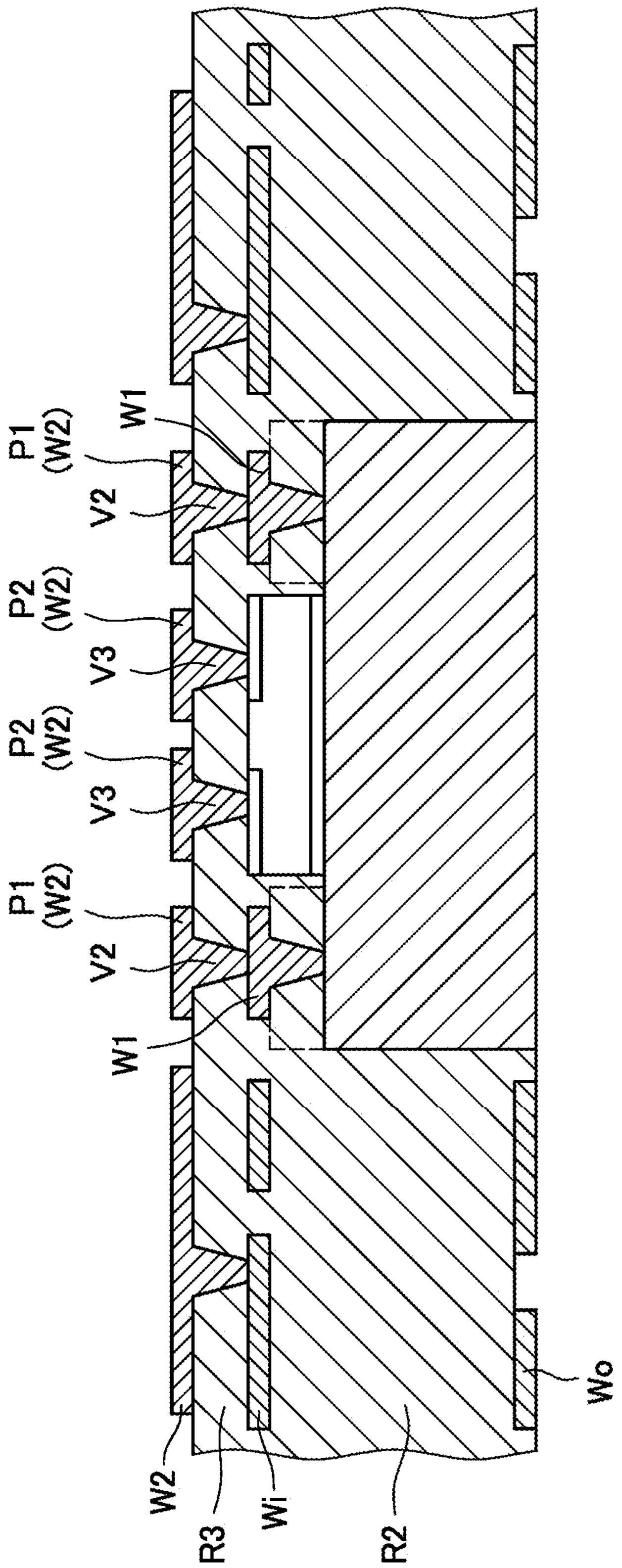
FIG. 5 is a sectional view representing a via connection step according to the first embodiment.

FIG. 5 is a sectional view representing the via connection step according to the first embodiment. The second wiring layer W2 formed in the buildup step is subjected to patterning, and a first terminal conducting portion P1 which is connected to the first wiring layer W1 due to formation of a second conductive via V2 and a second terminal conducting portion P2 which is connected to the second connecting terminal 2*b* of the electronic device 2 due to formation of a third conductive via V3 are formed on the second wiring layer W2 (the via connection step). Accordingly, in the electronic device 2, the second connecting terminal 2*b* is connected to the second terminal conducting portion P2 on the second wiring layer W2 via the third conductive via V3 and, at the same time, a conductive path is formed which conductively connects the first connecting terminal 2*a* to the first terminal conducting portion P1 on the second wiring layer W2 via the metal block 3, the first conductive via V1, and the second conductive via V2.

In this case, in the present embodiment, the conductive path constituted of the first conductive via V1 and the second conductive via V2 is provided on both sides in the lateral direction so as to sandwich the electronic device 2. Therefore, not only can a relatively large current which flows between the first connecting terminal 2*a* of the electronic device 2 and the second wiring layer W2 be dispersed but a heat transfer path from the electronic device 2 to the metal block 3 can also be expanded to both sides in the lateral direction.

In addition, the device embedded substrate 1 shown in FIG. 1 is completed by peeling off the temporary fixing tape 6 from the outer wiring layer Wo and providing the exposed metal block 3 with the heat sink 5 when necessary.

Figure 6:
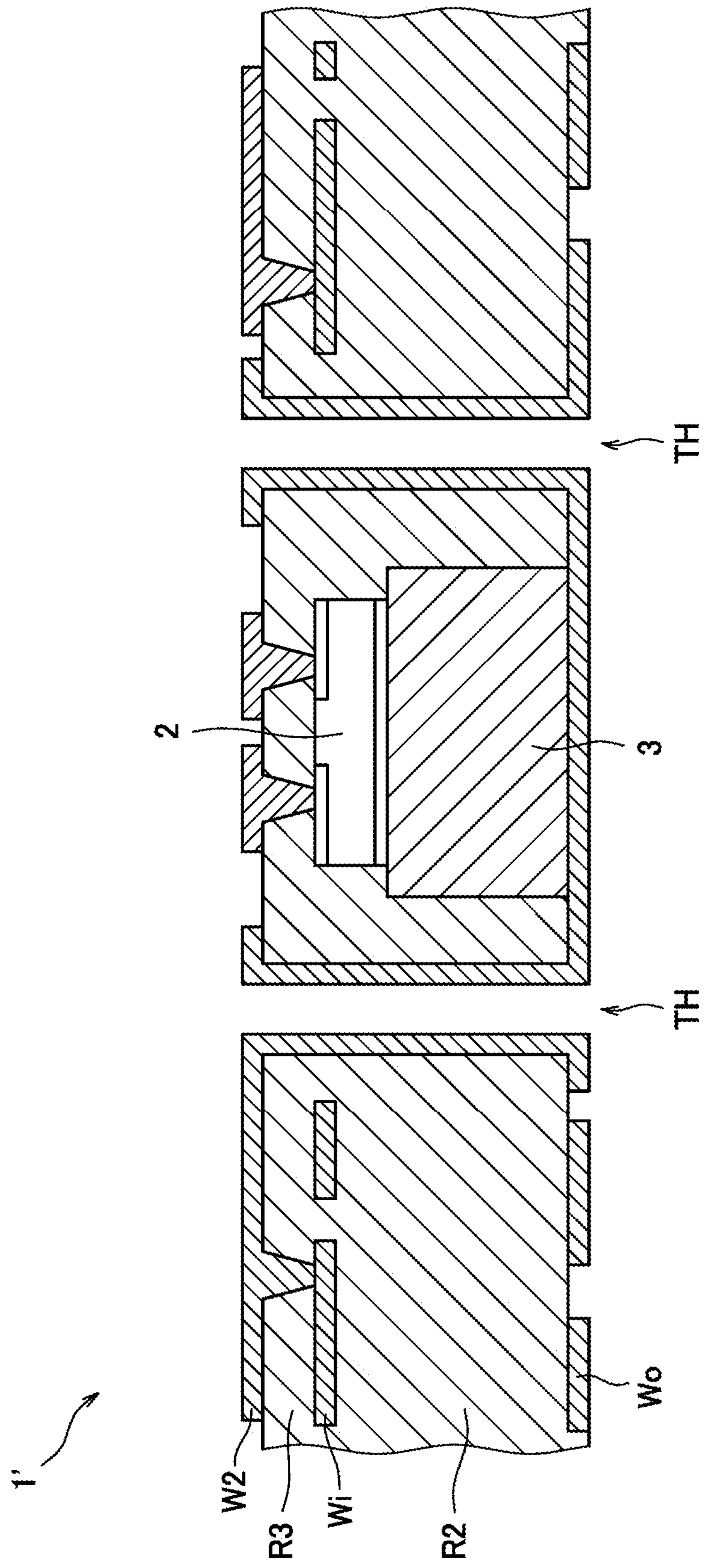
FIG. 6 is a sectional view representing a device embedded substrate according to a comparative example.

Next, an operational advantage of the device embedded substrate 1 according to the present invention will be described while exemplifying a comparative example in which the outer wiring layer Wo and the second wiring layer W2 are connected to each other by a through-hole in contrast to related art which is related to a device embedded heat-dissipating substrate. FIG. 6 is a sectional view representing a device embedded substrate 1' according to the comparative example.

The device embedded substrate 1' according to the comparative example shares common ground with the device embedded substrate 1 according to the present invention in terms of the first connecting terminal 2*a* of the electronic device 2 to be embedded being conductively connected to the metal block 3 and the second connecting terminal 2*b* of the electronic device 2 to be embedded being conductively connected to the second wiring layer W2 via a connecting via. On the other hand, in the device embedded substrate 1' according to the comparative example, since the first connecting terminal 2*a* is conductively connected to the outer wiring layer Wo via the metal block 3, a conductive path from the first connecting terminal 2*a* to the second wiring layer W2 is provided by forming a through-hole TH which connects the outer wiring layer Wo and the second wiring layer W2 with each other.

However, since a dedicated area for forming the through-hole TH must be secured for the device embedded substrate 1' according to the comparative example, downsizing is inhibited and, what is more, there is a possibility that noise reduction is to be inhibited due to an increased wiring length of the conductive path.

In contrast, as shown in FIG. 1, in the device embedded substrate 1 according to the present invention, the metal block 3 of which a dimension in the lateral direction is larger than that of the electronic device 2 is embedded as a heat-transfer member together with the electronic device 2, and the second wiring layer W2 is connected to one surface of the metal block 3 by both the conductive path via the electronic device 2 and the third conductive via V3 and the conductive path via the first conductive via V1 and the second conductive via V2. Therefore, in the device embedded substrate 1, an efficient heat-dissipating path from the electronic device 2 via the metal block 3 is formed and, at the same time, the first connecting terminal 2*a* in contact with the metal block 3 inside the substrate can be conductively connected to the second wiring layer W2 while saving space and with a short wiring length via a conductive path made up of the metal block 3, the first conductive via V1, and the second conductive via V2.

Consequently, with the device embedded substrate 1 according to the first embodiment of the present invention, even when the electronic device 2 to be embedded in a substrate capable of efficiently dissipating heat is provided with the first connecting terminal 2*a* and the second connecting terminal 2*b* on both surfaces, both electrode terminals can be conductively connected to the second wiring layer W2 while achieving downsizing and noise reduction.

In addition, in the device embedded substrate 1, by aligning heights of upper surfaces of the first wiring layer W1 and the second connecting terminal 2*b* of the electronic device 2 in the intermediate connection step shown in FIG. 2, a distance from the second wiring layer W2 to the first wiring layer W1 in the via connection step shown in FIG. 5 is to be set the same as a distance from the second wiring layer W2 to the second connecting terminal 2*b* of the electronic device 2. Accordingly, since the second conductive via V2 formed from the second wiring layer W2 to the first wiring layer W1 and the third conductive via V3 formed from the second wiring layer W2 to the second connecting terminal 2*b* are adjusted to a same length in the via connection step, vias can be readily formed with high accuracy and an improvement in quality can be achieved.

Figure 16:
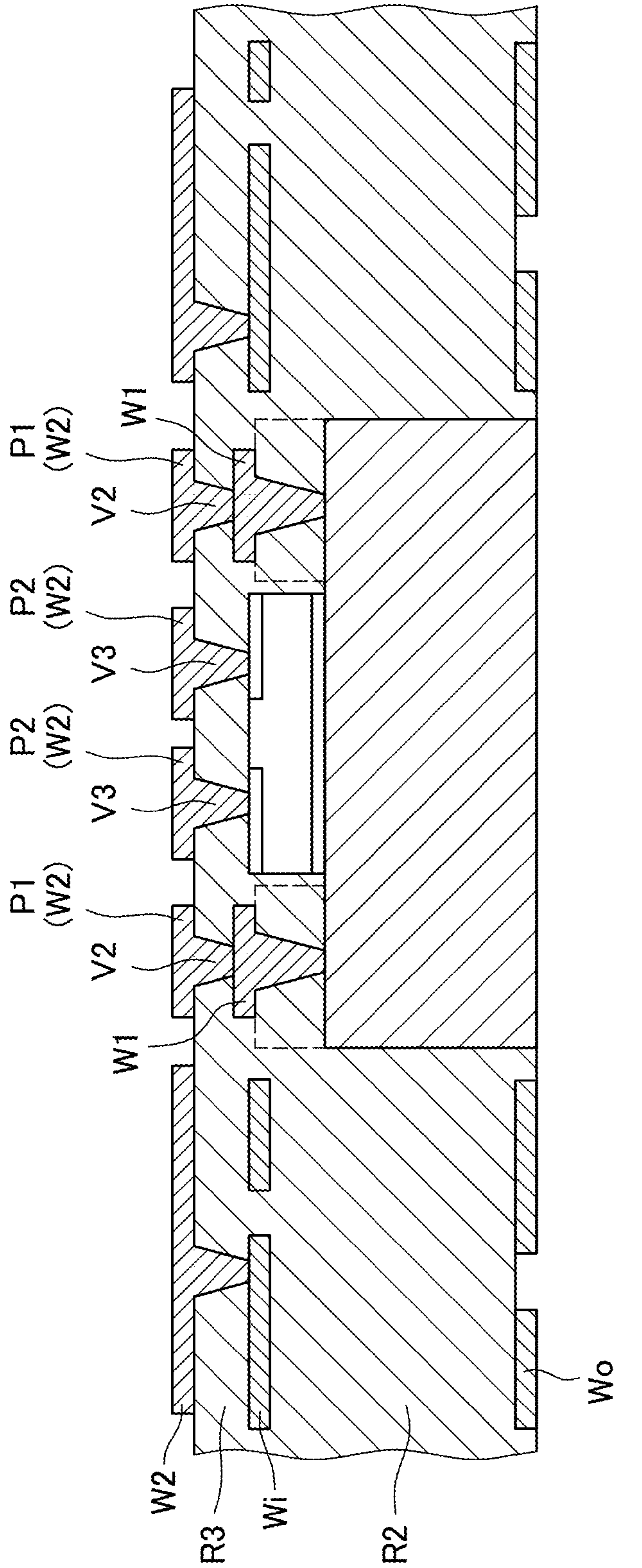
FIG. 16 is a sectional view representing another via connection step according to the first embodiment.

Alternatively, as shown in FIG. 16, in the device embedded substrate 1, by setting an upper surface of the first wiring layer W1 higher than that of the second connecting terminal 2*b* of the electronic device 2 in the intermediate connection step shown in FIG. 2, the distance from the second wiring layer W2 to the first wiring layer W1 in the buildup step shown in FIG. 4 is to be set shorter than the distance from the second wiring layer W2 to the second connecting terminal 2*b* of the electronic device 2. Accordingly, in the buildup step, stress which the electronic device 2 is subjected to when the third insulation layer R3 and the second wiring layer W2 are stacked on the electronic device 2 and the first wiring layer W1 and heat and pressure are applied thereto is reduced and a risk of damage to be sustained by the electronic device 2 can be reduced.

Furthermore, in the device embedded substrate 1, by adjusting a thickness of the second insulation layer R2 or the metal block 3 and aligning heights of upper surfaces of the inner wiring layer Wi and the first wiring layer W1 in the accommodation step shown in FIG. 3, the distance from the second wiring layer W2 to the inner wiring layer Wi in the via connection step shown in FIG. 5 is to be set the same as the distance from the second wiring layer W2 to the first wiring layer W1. Accordingly, since the second conductive via V2 formed from the second wiring layer W2 to the first wiring layer W1 and the conductive via formed from the second wiring layer W2 to the inner wiring layer Wi are adjusted to a same length in the via connection step, vias can be readily formed with high accuracy and an improvement in quality can be achieved.

Figure 7:
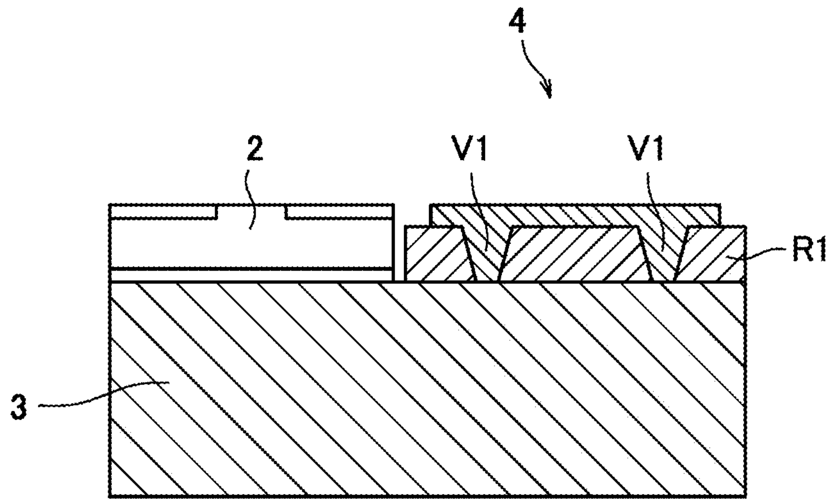
FIG. 7 is a sectional view representing a mode of an intermediate connecting portion according to a first modification.

In this case, the intermediate connecting portion 4 described above can be modified to several different modes in place of the intermediate connection step shown in FIG. 2. For example, FIG. 7 is a sectional view representing a mode of the intermediate connecting portion 4 according to a first modification. In the first modification, the first insulation layer R1 and the first wiring layer W1 are stacked on one side in the lateral direction of the electronic device 2 on the upper surface of the metal block 3 to form the intermediate connecting portion 4 in which two first conductive vias V1 are placed in parallel. Therefore, when forming the two first conductive vias V1 for dispersing current, the step of separating the first insulation layer and the first wiring layer from each other can be omitted.

Figure 8:
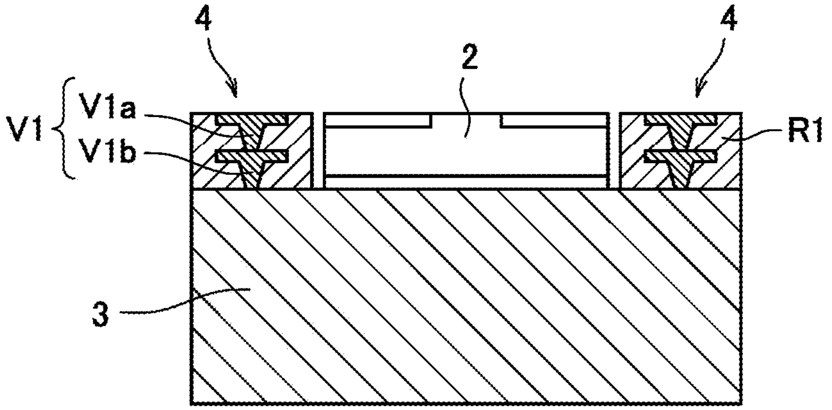
FIG. 8 is a sectional view representing a mode of an intermediate connecting portion according to a second modification.

In addition, FIG. 8 is a sectional view representing a mode of the intermediate connecting portion 4 according to a second modification. In the second modification, in the intermediate connecting portion 4 formed on both sides of the electronic device 2, the first conductive via V1 is formed as a stacked via made up of a first micro via V1*a* and a second micro via V1*b*. Therefore, since the first micro via V1*a* and the second micro via V1*b* can be formed smaller than other conductive vias, space for the intermediate connecting portion 4 can be saved with respect to the lateral direction. Furthermore, a height of the first conductive via V1 can be readily adjusted by adjusting the number of stacks in the stacked via. Note that the first conductive via V1 may be a staggered via in which the first micro via V1*a* and the second micro via V1*b* are connected while being displaced in the lateral direction.

Figure 9:
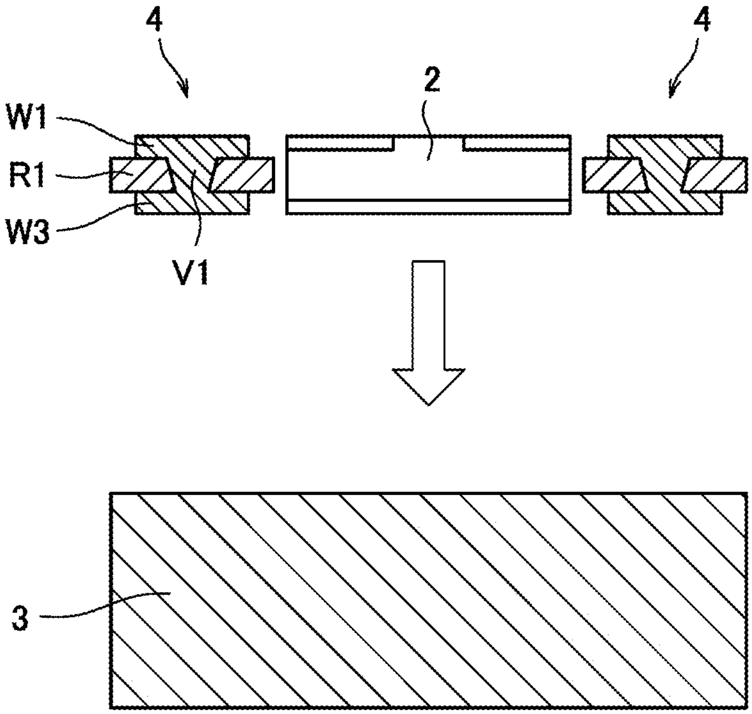
FIG. 9 is a sectional view representing a mode of an intermediate connecting portion according to a third modification.

Furthermore, FIG. 9 is a sectional view representing a mode of the intermediate connecting portion 4 according to a third modification. In the third modification, the intermediate connecting portion 4 is provided with the third wiring layer W3 which sandwiches the first insulation layer R1 in cooperation with the first wiring layer W1 at a boundary with the metal block 3. Therefore, the intermediate connecting portion 4 can be relatively readily formed by, for example, providing a ready-made double-sided board with an opening portion for accommodating the electronic device 2 and connecting the double-sided board together with the electronic device 2 to the metal block 3 via an adhesive material (not illustrated) such as a high-temperature solder, a conductive adhesive, or a sintering agent.

Second Embodiment

Next, a second embodiment of the present invention will be described. A device embedded substrate 1 according to the second embodiment differs from the device embedded substrate 1 according to the first embodiment described above in procedures of a manufacturing method thereof. Hereinafter, a description will be given with a focus on differences from the first embodiment and constituent elements in common with the first embodiment will be denoted by the same reference signs and detailed descriptions thereof will be omitted.

Hereinafter, a manufacturing method of the device embedded substrate 1 according to the second embodiment of the present invention will be described in detail with reference to FIGS. 10 to 14. The manufacturing method of the device embedded substrate 1 according to the second embodiment includes a block preparation step, an embedding step, an intermediate connection step, a device accommodation step, a buildup step, and a via connection step.

Figure 10:
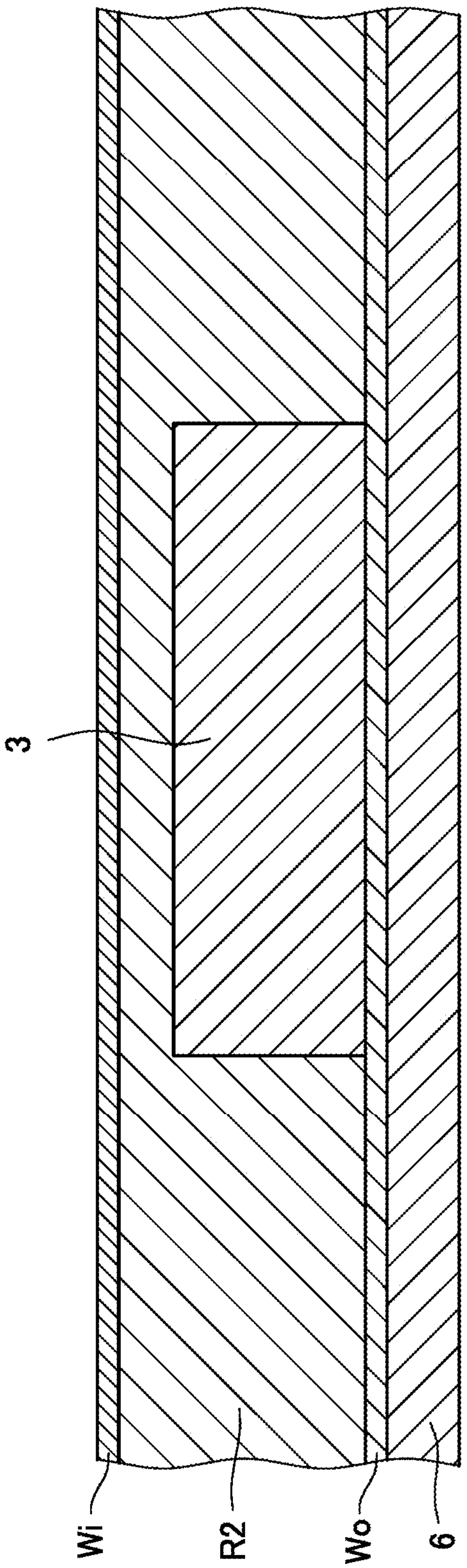
FIG. 10 is a sectional view representing a block preparation step and an embedding step according to a second embodiment.

FIG. 10 is a sectional view representing the block preparation step and the embedding step according to the second embodiment. In the manufacturing of the device embedded substrate 1 according to the second embodiment, first, a metal block 3 similar to that of the first embodiment is prepared (the block preparation step), and a second insulation layer R2 and an inner wiring layer Wi are formed so as to embed the metal block 3 (the embedding step).

More specifically, in the embedding step, an outer wiring layer Wo made of a copper foil is arranged with respect to a temporary fixing tape 6, and by placing the metal block 3 on the outer wiring layer Wo, stacking a resin material and a copper foil, and applying heat and pressure, the second insulation layer R2 and the inner wiring layer Wi in which the metal block 3 is embedded are formed.

Figure 11:
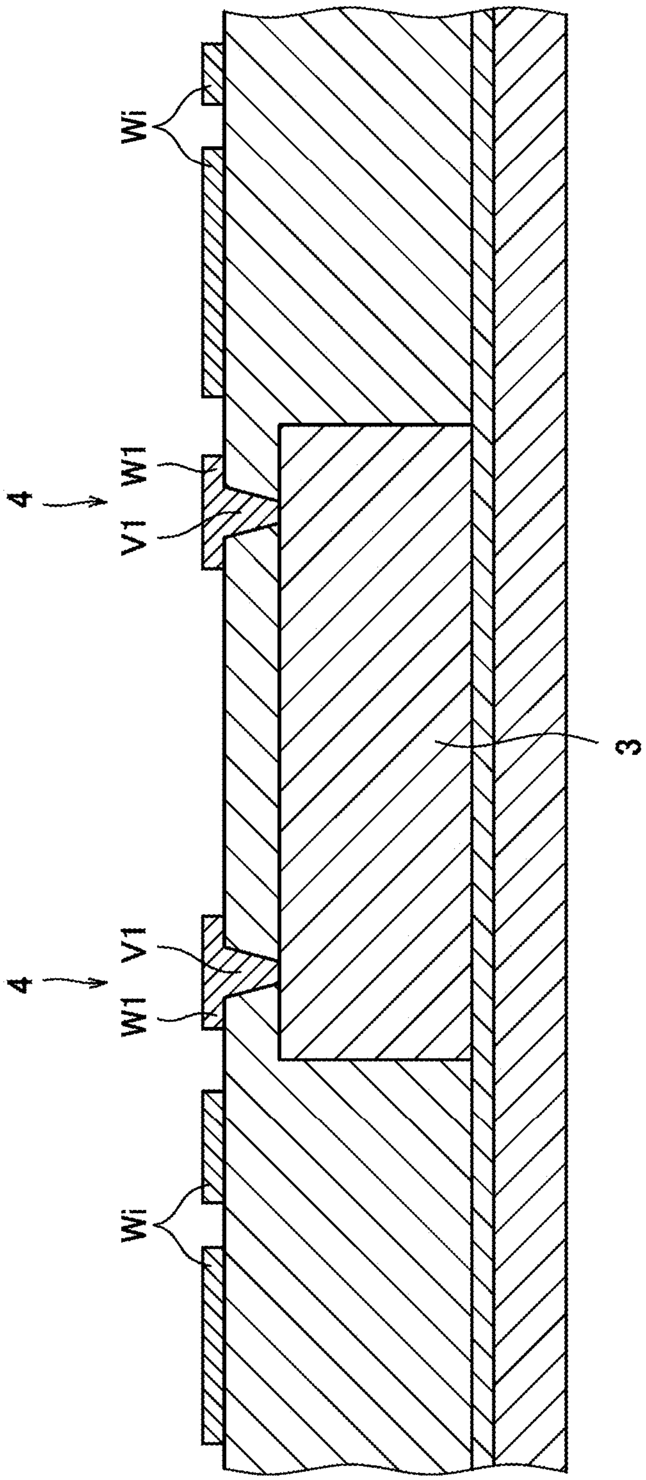
FIG. 11 is a sectional view representing an intermediate connection step according to the second embodiment.

FIG. 11 is a sectional view representing the intermediate connection step according to the second embodiment. When the second insulation layer R2 and the inner wiring layer Wi are stacked on the metal block 3 in the embedding step, patterning is applied to the inner wiring layer Wi. At this point, a part of the inner wiring layer Wi which opposes the metal block 3 is separated by patterning as a first wiring layer W1. In addition, an intermediate connecting portion 4 is formed by providing a first conductive via V1 which connects the first wiring layer W1 and one surface of the metal block 3 to each other (the intermediate connection step).

Figure 12:
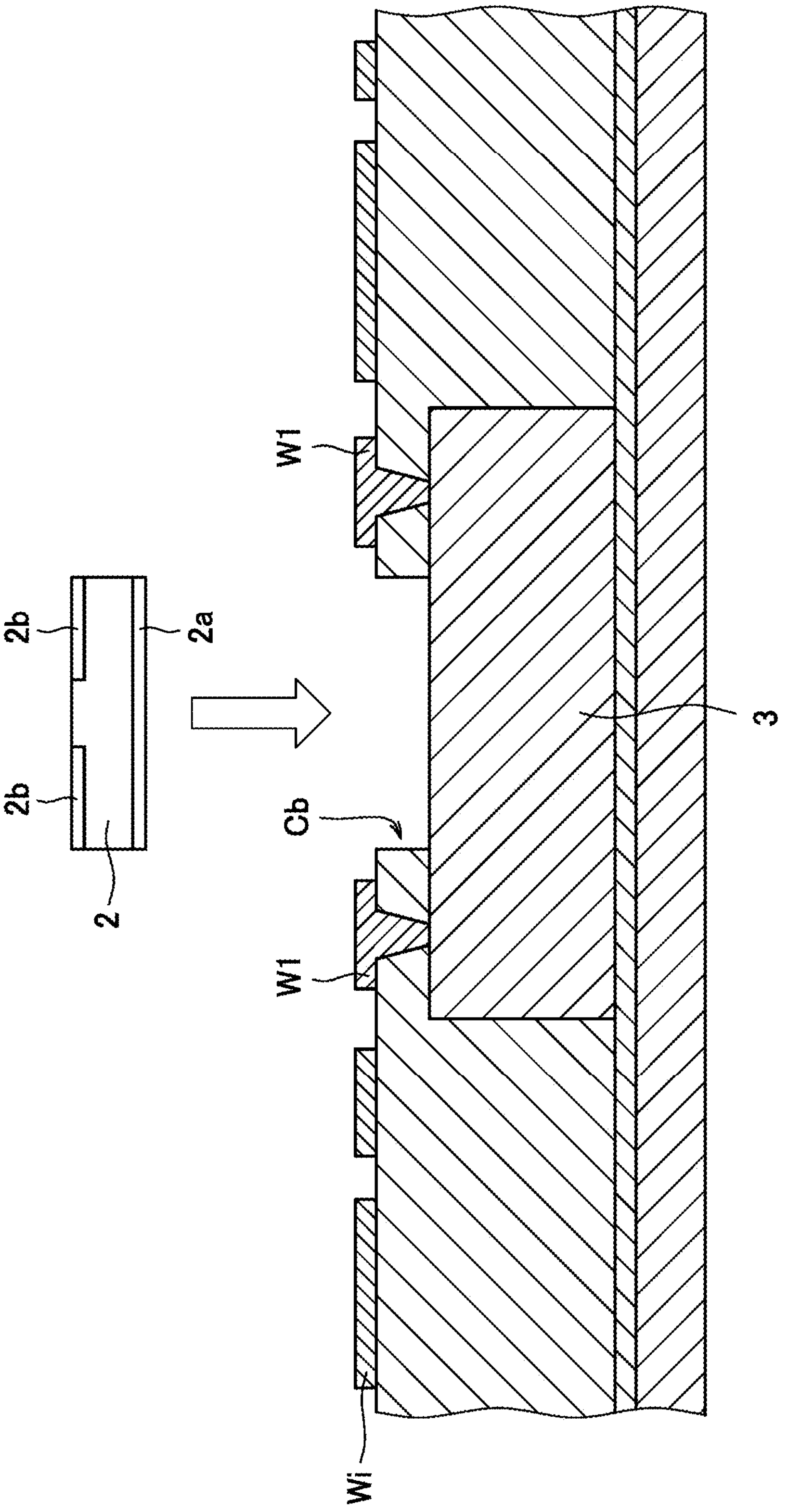
FIG. 12 is a sectional view representing a device accommodation step according to the second embodiment.

FIG. 12 is a sectional view representing the device accommodation step according to the second embodiment. When the intermediate connecting portion 4 is formed in the intermediate connection step, a part of the one surface of the metal block 3 is exposed by counterboring and an electronic device 2 is accommodated so that a first connecting terminal 2*a* comes into contact with the metal block 3 (the device accommodation step). In other words, a counterbored portion Cb is formed by a laser in a portion where the intermediate connecting portion 4 is not provided among an insulation layer immediately above the metal block 3 and the electronic device 2 is connected to the metal block 3 in the counterbored portion Cb via an adhesive material (not illustrated) such as a high-temperature solder, a conductive adhesive, or a sintering agent having superior electrical conductivity and heat-transfer property.

Figure 13:
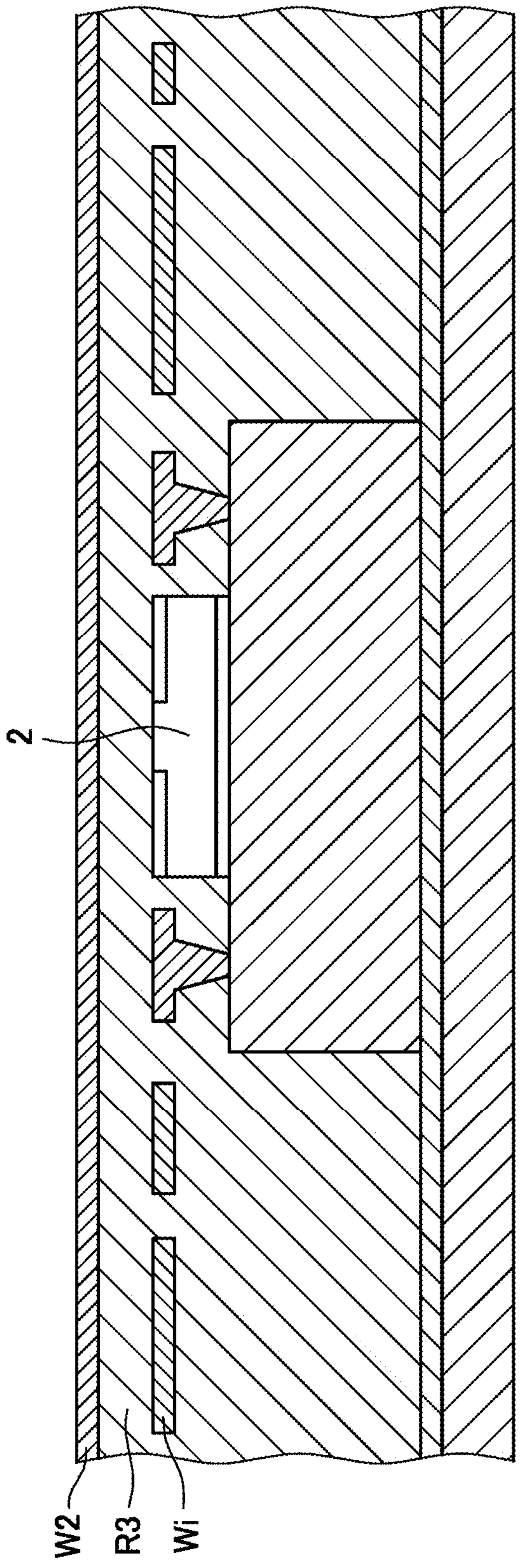
FIG. 13 is a sectional view representing a buildup step according to the second embodiment.

FIG. 13 is a sectional view representing the buildup step according to the second embodiment. When the electronic device 2 is accommodated in the counterbored portion Cb in the device accommodation step, a third insulation layer R3 and a second wiring layer W2 are stacked on the inner wiring layer Wi so as to embed the electronic device 2 (the buildup step). In the present step, for example, a prepreg is arranged so as to straddle the electronic device 2, the first wiring layer W1, and the inner wiring layer Wi and, at the same time, a buildup layer is formed by laminating a copper foil and subjecting the copper foil to heat and pressure.

In this case, a gap between the electronic device 2 and the intermediate connecting portion 4 is filled in a gapless manner due to an inflow of the prepreg which flows during the process of the buildup step. Therefore, preferably, the gap is configured to be as narrow as possible so that no voids remain.

Figure 14:
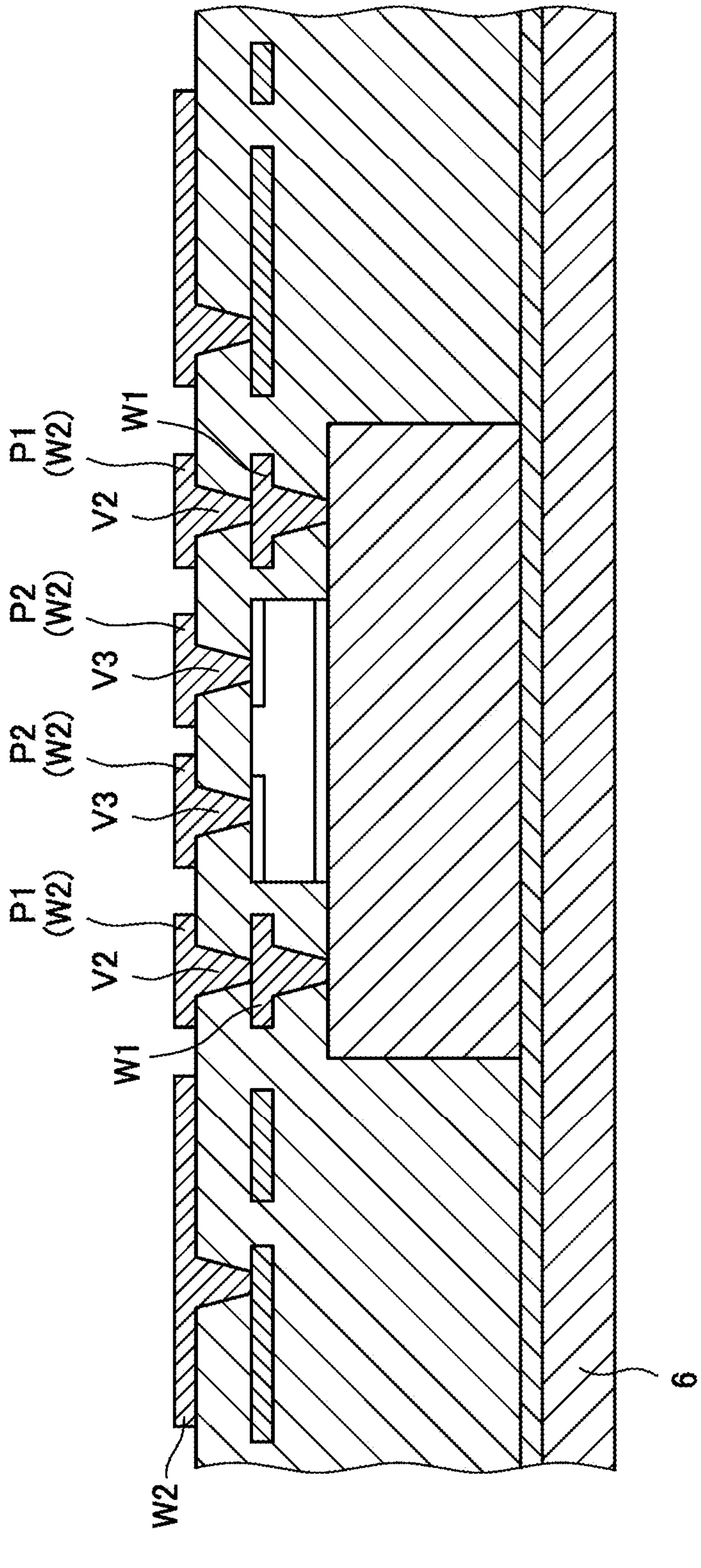
FIG. 14 is a sectional view representing a via connection step according to the second embodiment.

FIG. 14 is a sectional view representing the via connection step according to the second embodiment. The second wiring layer W2 formed in the buildup step is subjected to patterning, and a first terminal conducting portion P1 which is connected to the first wiring layer W1 due to formation of a second conductive via V2 and a second terminal conducting portion P2 which is connected to a second connecting terminal 2*b* of the electronic device 2 due to formation of a third conductive via V3 are formed on the second wiring layer W2 (the via connection step). Accordingly, in the electronic device 2, the second connecting terminal 2*b* is connected to the second terminal conducting portion P2 on the second wiring layer W2 via the third conductive via V3 and, at the same time, a conductive path is formed which conductively connects the first connecting terminal 2*a* to the first terminal conducting portion P1 on the second wiring layer W2 via the metal block 3, the first conductive via V1, and the second conductive via V2.

Figure 15:
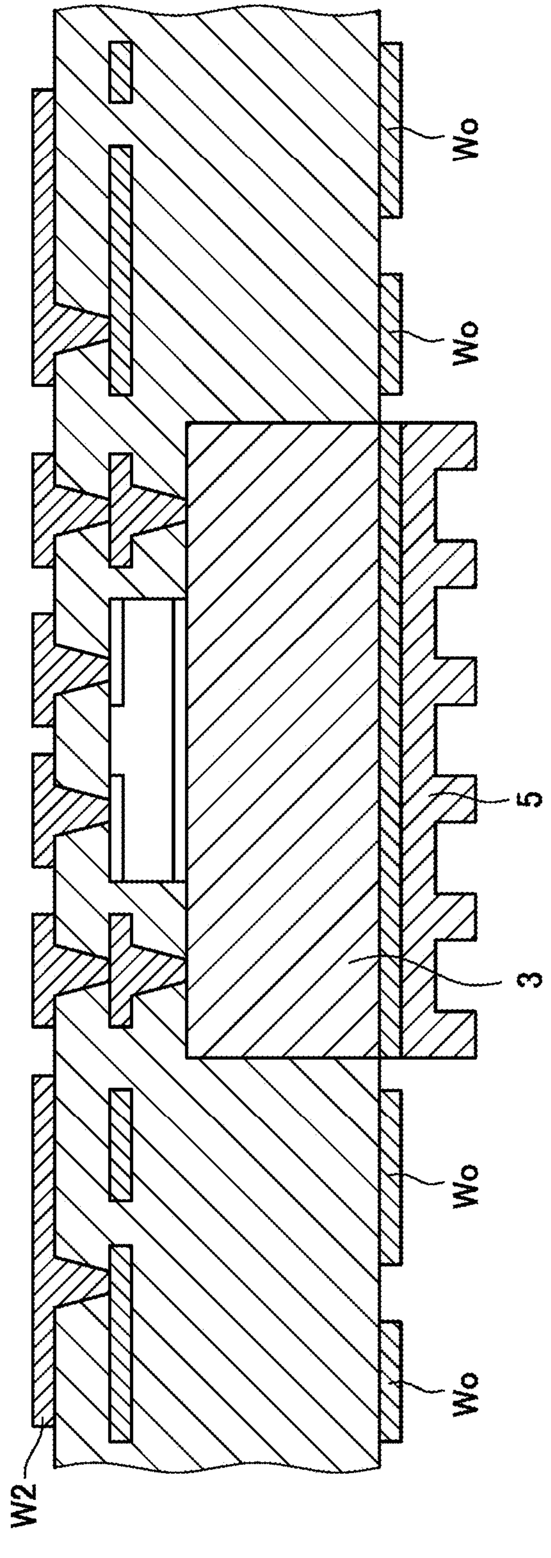
FIG. 15 is a sectional view representing a device embedded substrate according to the second embodiment.

FIG. 15 is a sectional view representing the device embedded substrate 1 according to the second embodiment. When connection of the second wiring layer is completed in the via connection step, the device embedded substrate 1 shown in FIG. 15 is completed by peeling off the temporary fixing tape 6 from the outer wiring layer Wo and, after the outer wiring layer Wo is patterned, providing a heat sink 5 when necessary. In this case, while a portion in contact with the metal block 3 among the outer wiring layer Wo may be removed in the patterning, if the portion is made of a same material as the metal block 3, both the portion and the metal block 3 may be integrated as a single metal block 3.

Consequently, with the manufacturing method of the device embedded substrate 1 according to the second embodiment of the present invention, the device embedded substrate 1 which is approximately the same as that of the first embodiment described earlier can be constructed and, even when the electronic device 2 to be embedded in a substrate capable of efficiently dissipating heat is provided with the first connecting terminal 2*a* and the second connecting terminal 2*b* on both surfaces, both electrode terminals can be conductively connected to the second wiring layer W2 while achieving downsizing and noise reduction.

<Implementations of Present Invention>

A device embedded substrate according to a first implementation of the present invention is a device embedded substrate into which is embedded an electronic device provided with a first connecting terminal on one surface and a second connecting terminal on another surface, the device embedded substrate including: a metal block which has electrical conductivity and a heat-transfer property, which has one surface to which the first connecting terminal of the electronic device is connected, and of which a dimension in a lateral direction is larger than that of the electronic device; an intermediate connecting portion which is juxtaposed to the electronic device in the lateral direction, which includes a first insulation layer and a first wiring layer, and of which the first wiring layer is connected to the one surface of the metal block via a first conductive via that penetrates the first insulation layer; a second insulation layer which accommodates the metal block; and a third insulation layer which is stacked on the second insulation layer so as to embed the electronic device and on which a second wiring layer is stacked, wherein the second wiring layer includes a first terminal conducting portion which is connected to the first wiring layer via a second conductive via that penetrates the third insulation layer and a second terminal conducting portion which is connected to the second connecting terminal of the electronic device via a third conductive via that penetrates the third insulation layer.

In the device embedded substrate according to the first implementation of the present invention, the metal block of which a dimension in the lateral direction is larger than that of the electronic device is embedded as a heat-transfer member together with the electronic device, and the second wiring layer is connected to the one surface of the metal block by both the conductive path via the electronic device and the third conductive via and the conductive path via the first conductive via and the second conductive via. Therefore, in the device embedded substrate, an efficient heat-dissipating path from the electronic device via the metal block is formed and, at the same time, the first connecting terminal in contact with the metal block inside the substrate can be conductively connected to the second wiring layer while saving space and with a short wiring length via a conductive path made up of the metal block, the first conductive via, and the second conductive via.

Consequently, with the device embedded substrate according to the first implementation of the present invention, even when the electronic device to be embedded in a substrate capable of efficiently dissipating heat is provided with the first electrode terminal and the second electrode terminal on both surfaces, both electrode terminals can be conductively connected to the second conductive layer while achieving downsizing and noise reduction.

In a device embedded substrate according to a second implementation of the present invention, a distance to the electronic device in the lateral direction from the first wiring layer is greater than a distance to the electronic device in the lateral direction from the first insulation layer in the first implementation of the present invention described above.

With the device embedded substrate according to the second implementation of the present invention, even when a width of a gap between the electronic device and the intermediate connecting portion is shortened in order to prevent a void from being formed therein, since the first wiring layer can be arranged at a sufficient distance in the lateral direction from the electronic device, a short-circuit between the second connecting terminal of the electronic device and the first wiring layer can be prevented.

In a device embedded substrate according to a third implementation of the present invention, a conductive path constituted of the first conductive via and the second conductive via is provided on both sides in the lateral direction so as to sandwich the electronic device in the first or second implementation of the present invention described above.

With the device embedded substrate according to the third implementation of the present invention, not only can a relatively large current which flows between the first connecting terminal of the electronic device and the second wiring layer be dispersed to two conductive paths but a heat transfer path from the electronic device to the metal block can also be expanded to both sides in the lateral direction.

In a device embedded substrate according to a fourth implementation of the present invention, a distance from the second wiring layer to the first wiring layer is set the same as a distance from the second wiring layer to the second connecting terminal of the electronic device in any one of the first to third implementations of the present invention described above.

With the device embedded substrate according to the fourth implementation of the present invention, since the second conductive via formed from the second wiring layer to the first wiring layer and the third conductive via formed from the second wiring layer to the second connecting terminal are adjusted to a same length, vias can be readily formed with high accuracy and an improvement in quality can be achieved.

In a device embedded substrate according to a fifth implementation of the present invention, a distance from the second wiring layer to the first wiring layer is set shorter than a distance from the second wiring layer to the second connecting terminal of the electronic device in any one of the first to third implementations of the present invention described above.

With the device embedded substrate according to the fifth implementation of the present invention, since the second connecting terminal of the electronic device is more separated from the second wiring layer than the first wiring layer, stress which the electronic device is subjected to when the third insulation layer and the second wiring layer are stacked on the electronic device and the first wiring layer and heat and pressure are applied thereto is reduced and a risk of damage to be sustained by the electronic device can be reduced.

In a device embedded substrate according to a sixth implementation of the present invention, an inner wiring layer is provided between the second insulation layer and the third insulation layer, and a distance from the second wiring layer to the inner wiring layer is set the same as a distance from the second wiring layer to the first wiring layer in any one of the first to fifth implementations of the present invention described above.

With the device embedded substrate according to the sixth implementation of the present invention, since the first conductive via formed from the second wiring layer to the first wiring layer and the conductive via formed from the second wiring layer to the inner wiring layer are adjusted to a same length, vias can be readily formed with high accuracy and an improvement in quality can be achieved.

In a device embedded substrate according to a seventh implementation of the present invention, the first conductive via is a stacked via or a staggered via in any one of the first to sixth implementations of the present invention described above.

With the device embedded substrate according to the seventh implementation of the present invention, since each individual conductive via can be formed smaller by constructing the first conductive via with a plurality of conductive vias, a space of the intermediate connecting portion can be saved with respect to the lateral direction and, what is more, a height of the first conductive via can be readily adjusted by adjusting the number of stacks of the stacked via or the staggered via.

In a device embedded substrate according to an eighth implementation of the present invention, the intermediate connecting portion is provided with a third wiring layer on a boundary with the metal block in any one of the first to seventh implementations of the present invention described above.

With the device embedded substrate according to the eighth implementation of the present invention, since the intermediate connecting portion can be constituted of, for example, a ready-made double-sided board to be connected to the metal block together with the electronic device via an adhesive material, the device embedded substrate can be relatively readily and inexpensively formed.

A manufacturing method of a device embedded substrate according to a ninth implementation of the present invention is a manufacturing method of a device embedded substrate into which is embedded an electronic device provided with a first connecting terminal on one surface and a second connecting terminal on another surface, the manufacturing method including: a block preparation step of preparing a metal block which has electrical conductivity and a heat-transfer property and of which a dimension in a lateral direction is larger than that of the electronic device; an intermediate connection step of connecting the first connecting terminal of the electronic device to one surface of the metal block, stacking a first insulation layer and a first wiring layer by juxtaposing the first insulation layer and the first wiring layer in the lateral direction on the electronic device, and connecting the first wiring layer with a first conductive via that penetrates the first insulation layer; an accommodation step of accommodating the metal block in a second insulation layer; a buildup step of stacking a third insulation layer and a second wiring layer on the second insulation layer so as to embed the electronic device; and a via connection step of forming, in the second wiring layer, a first terminal conducting portion which is connected to the first wiring layer by a second conductive via that penetrates the third insulation layer and a second terminal conducting portion which is connected to the second connecting terminal of the electronic device by a third conductive via that penetrates the third insulation layer.

In the manufacturing method of a device embedded substrate according to the ninth implementation of the present invention, the metal block of which a dimension in the lateral direction is larger than that of the electronic device is embedded as a heat-transfer member together with the electronic device, and the second wiring layer is connected to the one surface of the metal block by both the conductive path via the electronic device and the third conductive via and the conductive path via the first conductive via and the second conductive via. Therefore, in the manufacturing method of a device embedded substrate, an efficient heat-dissipating path from the electronic device via the metal block is formed and, at the same time, the first connecting terminal in contact with the metal block inside the substrate can be conductively connected to the second wiring layer while saving space and with a short wiring length via a conductive path made up of the metal block, the first conductive via, and the second conductive via.

Consequently, with the manufacturing method of a device embedded substrate according to the ninth implementation of the present invention, even when the electronic device to be embedded in a substrate capable of efficiently dissipating heat is provided with the first electrode terminal and the second electrode terminal on both surfaces, both electrode terminals can be conductively connected to the second conductive layer while achieving downsizing and noise reduction.

In a manufacturing method of a device embedded substrate according to a tenth implementation of the present invention, a distance to the electronic device in the lateral direction from the first wiring layer is set greater than a distance to the electronic device in the lateral direction from the first insulation layer in the ninth implementation of the present invention described above.

With the manufacturing method of a device embedded substrate according to the tenth implementation of the present invention, even when a width of a gap between the electronic device and the first insulation layer is shortened in order to prevent a void from being formed therein, since the first wiring layer can be arranged at a sufficient distance in the lateral direction from the electronic device, a device embedded substrate in which short-circuiting between the second connecting terminal of the electronic device and the first wiring layer is prevented can be manufactured.

In a manufacturing method of a device embedded substrate according to an eleventh implementation of the present invention, a conductive path constituted of the first conductive via and the second conductive via is provided on both sides in the lateral direction so as to sandwich the electronic device in the ninth or tenth implementation of the present invention described above.

With the manufacturing method of a device embedded substrate according to the eleventh implementation of the present invention, not only can a relatively large current which flows between the first connecting terminal of the electronic device and the second wiring layer be dispersed to two conductive paths but a heat transfer path from the electronic device to the metal block can also be expanded to both sides in the lateral direction.

In a manufacturing method of a device embedded substrate according to a twelfth implementation of the present invention, a distance from the second wiring layer to the first wiring layer is set the same as a distance from the second wiring layer to the second connecting terminal of the electronic device in any one of the ninth to eleventh implementations of the present invention described above.

With the manufacturing method of a device embedded substrate according to the twelfth implementation of the present invention, since the second conductive via formed from the second wiring layer to the first wiring layer and the third conductive via formed from the second wiring layer to the second connecting terminal are adjusted to a same length, vias can be readily formed with high accuracy and an improvement in quality can be achieved.

In a manufacturing method of a device embedded substrate according to a thirteenth implementation of the present invention, a distance from the second wiring layer to the first wiring layer is set shorter than a distance from the second wiring layer to the second connecting terminal of the electronic device in any one of the ninth to eleventh implementations of the present invention described above.

With the manufacturing method of a device embedded substrate according to the thirteenth implementation of the present invention, since the second connecting terminal of the electronic device is more separated from the second wiring layer than the first wiring layer, stress which the electronic device is subjected to when the third insulation layer and the second wiring layer are stacked on the electronic device and the first wiring layer and heat and pressure are applied thereto is reduced and a risk of damage to be sustained by the electronic device can be reduced.

In a manufacturing method of a device embedded substrate according to a fourteenth implementation of the present invention, an inner wiring layer is formed between the second insulation layer and the third insulation layer, and a distance from the second wiring layer to the inner wiring layer is set the same as a distance from the second wiring layer to the first wiring layer in any one of the ninth to thirteenth implementations of the present invention described above.

With the manufacturing method of a device embedded substrate according to the fourteenth implementation of the present invention, since the second connecting terminal of the electronic device is more separated from the second wiring layer than the first wiring layer, stress which the electronic device is subjected to when the third insulation layer and the second wiring layer are stacked on the electronic device and the first wiring layer and heat and pressure are applied thereto is reduced and a risk of damage to be sustained by the electronic device can be reduced.

In a manufacturing method of a device embedded substrate according to a fifteenth implementation of the present invention, the first conductive via is a stacked via or a staggered via in any one of the ninth to fourteenth implementations of the present invention described above.

With the manufacturing method of a device embedded substrate according to the fifteenth implementation of the present invention, since each individual conductive via can be formed smaller by constructing the first conductive via with a plurality of conductive vias, the intermediate connection step can be performed in a space-saving manner with respect to the lateral direction and, what is more, a height of the first conductive via can be readily adjusted by adjusting the number of stacks of the stacked via or the staggered via.

In a manufacturing method of a device embedded substrate according to a sixteenth implementation of the present invention, a third wiring layer is provided on a boundary between the metal block and the first insulation layer in the intermediate connection step in any one of the ninth to fifteenth implementations of the present invention described above.

With the manufacturing method of a device embedded substrate according to the sixteenth implementation of the present invention, since the device embedded substrate can be constituted of, for example, a ready-made double-sided board to be connected to the metal block together with the electronic device via an adhesive material in the intermediate connection step, the device embedded substrate can be relatively readily and inexpensively formed.

A manufacturing method of a device embedded substrate according to a seventeenth implementation of the present invention is a manufacturing method of a device embedded substrate into which is embedded an electronic device provided with a first connecting terminal on one surface and a second connecting terminal on another surface, the manufacturing method including: a block preparation step of preparing a metal block which has electrical conductivity and a heat-transfer property and of which a dimension in a lateral direction is larger than that of the electronic device; an embedding step of forming a second insulation layer and an inner wiring layer so as to embed the metal block; an intermediate connection step of separating a part of the inner wiring layer opposing the metal block by patterning as a first wiring layer and providing a first conductive via which connects the first wiring layer and one surface of the metal block to each other; a device accommodation step of exposing a part of the one surface of the metal block by counterboring and accommodating the electronic device so that the first connecting terminal comes into contact with the metal block; a buildup step of stacking a third insulation layer and a second wiring layer on the inner wiring layer so as to embed the electronic device; and a via connection step of forming, in the second wiring layer, a first terminal conducting portion to be connected to the first wiring layer by a second conductive via that penetrates the third insulation layer and a second terminal conducting portion to be connected to the second connecting terminal of the electronic device by a third conductive via that penetrates the third insulation layer.

In the manufacturing method of a device embedded substrate according to the seventeenth implementation of the present invention, the metal block of which a dimension in the lateral direction is larger than that of the electronic device is embedded as a heat-transfer member together with the electronic device, and the second wiring layer is connected to one surface of the metal block by both the conductive path via the electronic device and the third conductive via and the conductive path via the first conductive via and the second conductive via. Therefore, in the manufacturing method of a device embedded substrate, an efficient heat-dissipating path from the electronic device via the metal block is formed and, at the same time, the first connecting terminal in contact with the metal block inside the substrate can be conductively connected to the second wiring layer while saving space and with a short wiring length via a conductive path made up of the metal block, the first conductive via, and the second conductive via.

Consequently, with the manufacturing method of a device embedded substrate according to the seventeenth implementation of the present invention, even when the electronic device to be embedded in a substrate capable of efficiently dissipating heat is provided with the first electrode terminal and the second electrode terminal on both surfaces, both electrode terminals can be conductively connected to the second conductive layer while achieving downsizing and noise reduction.

EXPLANATION OF REFERENCE SIGNS

1 Device embedded substrate
2 Electronic device
**2*a*** First connecting terminal

2*b* Second connecting terminal
3 Metal block
4 Intermediate connecting portion
5 Heat sink
6 Temporary fixing tape
R1 to R3 First insulation layer to third insulation layer
V1 to V3 First conductive via to third conductive via
W1 to W2 First wiring layer to second wiring layer
P1 First terminal conducting portion
P2 Second terminal conducting portion
Wo Outer wiring layer
Wi Inner wiring layer
G Gap
Cb Counterbored portion
Cs Accommodating portion

The invention claimed is:

1. A device embedded substrate into which is embedded an electronic device provided with a first connecting terminal on a first surface and a second connecting terminal on a second surface, the device embedded substrate comprising:

- a metal block which has electrical conductivity and a heat-transfer property, which has one surface to which the first connecting terminal of the electronic device is connected, and of which a dimension in a lateral direction is larger than that of the electronic device;
- an intermediate connecting portion, which is juxtaposed to the electronic device in the lateral direction, and includes:
  - a first insulation layer connected to the one surface of the metal block,
  - a first conductive via that penetrates the first insulation layer, and
  - a first wiring layer connected to the one surface of the metal block by the first conductive via through the first insulation layer;
- a second insulation layer which accommodates the metal block and is directly connected to two sides of the metal block that each connect to the one surface and a portion of the one surface of the metal block that is between the intermediate connecting portion and the electronic device; and
- a third insulation layer which is stacked on the second insulation layer and the second surface of the electronic device so as to embed the electronic device and a second wiring layer is stacked on top of the third insulation layer, wherein second wiring layer includes:
  - a first terminal conducting portion which is connected to the first wiring layer through a second conductive via that penetrates the third insulation layer, and
  - a second terminal conducting portion which is directly connected to the second connecting terminal of the electronic device through a third conductive via formed on the second wiring layer that penetrates the third insulation layer.

2. The device embedded substrate according to claim 1, wherein a distance to the electronic device in the lateral direction from the first wiring layer is greater than a distance to the electronic device in the lateral direction from the first insulation layer.

3. The device embedded substrate according to claim 1, wherein a conductive path constituted of the first conductive via and the second conductive via is provided on both sides of the electronic device in the lateral direction so as to sandwich the electronic device.

4. The device embedded substrate according to claim 1, wherein a distance from the second wiring layer to the first wiring layer is set the same as a distance from the second wiring layer to the second connecting terminal of the electronic device.

5. The device embedded substrate according to claim 1, wherein a distance from the second wiring layer to the first wiring layer is set shorter than a distance from the second wiring layer to the second connecting terminal of the electronic device.

6. The device embedded substrate according to claim 1, further comprising:

- an inner wiring layer is provided between the second insulation layer and the third insulation layer, and
- wherein a distance from the second wiring layer to the inner wiring layer is set the same as a distance from the second wiring layer to the first wiring layer.

7. The device embedded substrate according to claim 1, wherein the first conductive via is a stacked via or a staggered via.

8. The device embedded substrate according to claim 1, wherein the intermediate connecting portion is further provided with a third wiring layer on a boundary with the metal block.

9. The device embedded substrate according to claim 1, wherein

- the one surface of the metal block is flat in the lateral direction, and
- a distance from an upper surface of the first wiring layer to the one surface of the metal block is the same as a distance from the second surface of the electronic device to the one surface of the metal block.

10. The device embedded substrate according to claim 1, wherein the first insulation layer, the second insulation layer, and the third insulation layer are formed of a same resin material.

11. The device embedded substrate according to claim 1, wherein a widest portion of the first wiring layer is larger than a widest portion of the second conductive via.

12. A manufacturing method of a device embedded substrate into which is embedded an electronic device provided with a first connecting terminal on a first surface and a second connecting terminal on a second surface, the manufacturing method comprising:

- a block preparation step of preparing a metal block which has electrical conductivity and a heat-transfer property and of which a dimension in a lateral direction is larger than that of the electronic device;
- an intermediate connection step of:
  - connecting the first connecting terminal of the electronic device to one surface of the metal block,
  - stacking on the one surface of the metal block, a first insulation layer and a first wiring layer by juxtaposing the first insulation layer and the first wiring layer in the lateral direction on the electronic device, and
  - connecting the first wiring layer with a first conductive via that penetrates the first insulation layer;
- an accommodation step of accommodating the metal block in a second insulation layer and directly connecting two sides of the metal block that each connect to the one surface and a portion of the one surface of the metal block that is between the intermediate connecting portion and the electronic device;
- a buildup step of:
  - stacking a third insulation layer on the second insulation layer and the second surface of the electronic device so as to embed the electronic device, and stacking a second wiring layer on top of the third insulation layer; and a via connection step of forming, in the second wiring layer;

a first terminal conducting portion which is connected to the first wiring layer by a second conductive via that penetrates the third insulation layer, and a second terminal conducting portion which is directly connected to the second connecting terminal of the electronic device by a third conductive via formed on the second wiring layer that penetrates the third insulation layer.

13. The manufacturing method of the device embedded substrate according to claim 12, wherein a distance to the electronic device in the lateral direction from the first wiring layer is set greater than a distance to the electronic device in the lateral direction from the first insulation layer.

14. The manufacturing method of the device embedded substrate according to claim 12, wherein a conductive path constituted of the first conductive via and the second conductive via is provided on both sides of the electronic device in the lateral direction so as to sandwich the electronic device.

15. The manufacturing method of the device embedded substrate according to claim 12, wherein a distance from the second wiring layer to the first wiring layer is set the same as a distance from the second wiring layer to the second connecting terminal of the electronic device.

16. The manufacturing method of the device embedded substrate according to claim 12, wherein a distance from the second wiring layer to the first wiring layer is set shorter than a distance from the second wiring layer to the second connecting terminal of the electronic device.

17. The manufacturing method of the device embedded substrate according to claim 12, wherein the accommodation step further includes forming an inner wiring layer between the second insulation layer and the third insulation layer, and a distance from the second wiring layer to the inner wiring layer is set the same as a distance from the second wiring layer to the first wiring layer.

18. The manufacturing method of the device embedded substrate according to claim 12, wherein the first conductive via is a stacked via or a staggered via.

19. The manufacturing method of the device embedded substrate according to claim 12, wherein a third wiring layer is provided on a boundary between the metal block and the first insulation layer in the intermediate connection step.

20. A manufacturing method of a device embedded substrate into which is embedded an electronic device provided with a first connecting terminal on one surface and a second connecting terminal on another surface, the manufacturing method comprising:

a block preparation step of preparing a metal block which has electrical conductivity and a heat-transfer property and of which a dimension in a lateral direction is larger than that of the electronic device;

an embedding step of forming a second insulation layer and an inner wiring layer so as to embed the metal block;

an intermediate connection step of separating a part of the inner wiring layer opposing the metal block by patterning as a first wiring layer and providing a first conductive via which connects the first wiring layer and one surface of the metal block to each other;

a device accommodation step of exposing a part of the one surface of the metal block by counterboring and accommodating the electronic device so that the first connecting terminal comes into contact with the metal block;

a buildup step of stacking a third insulation layer and a second wiring layer on the inner wiring layer so as to embed the electronic device; and a via connection step of forming, in the second wiring layer, a first terminal conducting portion which is connected to the first wiring layer by a second conductive via that penetrates the third insulation layer and a second terminal conducting portion which is connected to the second connecting terminal of the electronic device by a third conductive via that penetrates the third insulation layer.

* * * * *